United States Patent [19]

Hsia et al.

[11] 4,254,477
[45] Mar. 3, 1981

[54] RECONFIGURABLE MEMORY CIRCUIT

[75] Inventors: Yukun Hsia, Santa Ana; John A. Wishneusky, San Diego, both of Calif.

[73] Assignee: McDonnell Douglas Corporation, Long Beach, Calif.

[21] Appl. No.: 954,627

[22] Filed: Oct. 25, 1978

[51] Int. Cl.³ .................... G11C 11/40; G11C 13/00
[52] U.S. Cl. .................................. 365/200; 307/238; 365/190; 365/207
[58] Field of Search ............ 365/154, 156, 190, 200, 365/188, 207, 240; 307/238

[56] References Cited

U.S. PATENT DOCUMENTS

| | | | |
|---|---|---|---|
| 3,346,847 | 10/1967 | Faulkner | 365/240 |
| 4,007,452 | 2/1977 | Hoff et al. | 365/200 |
| 4,133,049 | 1/1979 | Shirato | 365/207 |

*Primary Examiner*—Terrell W. Fears
*Attorney, Agent, or Firm*—Henry G. Kohlmann; Walter J. Jason; Donald L. Royer

[57] ABSTRACT

The disclosed device uses an interconnect switch for the selective coupling of serial memory elements in series with other memory elements. A control unit may test elements, designate some of the elements as operable for use and designate other elements as spares. The memory system is defined by the states of interconnection which couple the memory elements either for operation or for sparing, and which uncouple the defective memory element from use in the system. Upon the failure of an element which is being used the control unit can switch out the defective memory cell and switch in a replacement element or simply bypass the defective element. This technique is particularly useful for wafer scale integration where a plurality of functional elements are contained on a single wafer; particularly in memory arrays which are individually addressable. However, this technique also allows the selective replacing of elements within the particular array to ensure the proper number of memory cells within the array. Individual selection of such memory cells allows the insertion of random sparing elements such that any memory cell within the string that becomes defective may be switched out and a new cell added at any point in the string thereby preventing the necessity of dual or triple redundancy for each cell. This switching ability or the adaptive feature of the circuit makes it possible to implement sparing to produce high reliability electronic systems while utilizing a minimum number of spare microcircuits on the wafer, or in a wired system composed of discrete LSI parts.

29 Claims, 7 Drawing Figures

RECONFIGURABLE MEMORY CIRCUIT

BACKGROUND OF THE INVENTION

1. Field of the Invention

The field of the present invention relates to an improved method and apparatus for interconnection of microcircuit elements on a wafer to enable high reliability wafer scale integration and a new improved memory circuit.

2. Prior Art

Present methods of semiconductor fabrication typically require that a plurality of identical semiconductor elements or circuits be fabricated on a single wafer substrate through a series of process steps. At the conclusion of the fabrication process, the elements or circuits are tested and the defective elements identified. The wafer is then scored and diced into individual parts, each containing a complete circuit. These operable parts are then packaged to provide external connections and appropriate environmental protection for the finished product.

It has long been realized that circuit costs as well as space and power requirements could be reduced if the operable parts or elements on the wafer could be interconnected on the wafer itself. This would reduce the necessity for circuit boards or interconnection wiring between elements. In addition, dicing would be eliminated and packaging would be relatively simple for the single wafer itself.

The variety of methods for interconnecting elements on a wafer which have been suggested these include a metalization step after the circuits or elements of the wafer are tested to interconnect the operable elements on the wafer. The disadvantage of this method is that a different mask is required for each individual wafer, due to the fact that not only the yield may be different for a given wafer but defects are randomly created. The production of a unique mask for each wafer not only greatly increases the cost of the finished product but is considerably time consuming thereby slowing the manufacturing process. Other wafer integration schemes such as described in U.S. Pat. No. 3,940,740, provide for spare rows and columns on the wafer matrix for appropriate sparing of defective elements. The disadvantage of this configuration is that an entire row of elements must be provided to spare a single defective matrix element. Also patents such as U.S. Pat. No. 4,092,733 provide schemes where multiple elemental structures may be interconnected. However, no particular circuitry is described to implement any particular memory structure. A preferred method would be one where spare memory elements may be inserted in the matrix on a random basis to allow all spare elements to be used, a technique which has not yet been perfected in the prior art.

SUMMARY OF THE INVENTION

This invention utilizes a reconfigurable memory circuit having an associated interconnect circuit with each memory cell within a memory array. Appropriate signals to the memory cell interconnect circuit will either engage the memory cell into communication with a common bus line or disengage defective memory cell out of such communication by effectively switching in a bypass path for data around the defective memory cell. As described before the prior art systems tend to be bulky, the actual area of the microcircuits themselves being far less than that of the printed circuit boards upon which they are mounted. They are also relatively expensive due to the large number of components and manufacturing steps both manual and automatic involved therein. Likewise, the number of bonds, both internal to the microcircuit packages and external from package to package connections result in decreased reliability. The efforts that have been made to interconnect the individual, that is, the chip level large scale integrated (LSI) microcircuits on their common wafer substrate have previously been proven costly and impractical. In addition, they share a common fault in that the interconnects cannot be repaired physically or can be repaired only at great cost. In military systems which require an improved reliability level, fault tolerant or redundant techniques are typically utilized. Such techniques indeed produce reliable military systems, but they entail significant cost and size penalties. An example, of course, is the triply redundant majority logic implementation of high reliability systems where a more than threefold increase in component hardware is required. This evidences itself as a two for one parallel arrangement. Should the same corresponding cell location fail twice the cell becomes inoperative. However, the instant invention corrects the failure of any number of cells and allows the switching of bad memory cells out of the array and a switching of good memory cells into the array. Upon the utilization of all spares available a reduction of the length of the memory array itself is possible while maintaining good continuous or sequential memory cells. Wafer scale integration (WSI), is a method for greatly decreasing the number of leads and bonds necessary to interconnect a given package with external electronics, however, unless there is an adaptive technique available WSI yield problems are insurmountable and require the inclusion of redundant circuits on the wafer thereby decreasing the yield per unit area of actual circuitry used. In the adaptive integration (AI) approach of the reconfigurable memory circuit of the instant invention, the good circuits are located by testing and are then connected to the interconnect bus by electrically alterable interconnect circuits to produce a complete subsystem on a single wafer ready for packaging. Not only does this AI approach eliminate the wafer die and break, die sorting, multidie and wire bonding steps, they also increase the yield of the microcircuits themselves per unit area on the wafer while providing improved reliability due to the reduction of the number of mechanical interconnection as well as adaptive sparing. A minimum number of spare microcircuits is set aside on a wafer. On detection of failure the failed component is by passed and the spare serially connected to the system bus. Thus sparing redundancy and high system reliability is accomplished with a minimum of hardware cost and little increase in dedicated circuitry. In the instant invention a memory cell which comprises a series of subcells comprising at least one static two bit register with two bits of nonvolatile MNOS memory in parallel with the two bits of the shift register in series with a plurality of such cells each having its own interconnect circuit associated with the individual memory cell. Data is shifted through the shift register forward one bit for each shift pulse. When data is positioned within the memory cell at selected MNOS storage sites the MNOS transistors are cleared by an erase pulse and a subsequent write pulse will copy data from the shift register into nonvolatile storage. A load pulse will copy data from nonvolatile memory into the shift register. The shift, load, erase, command effect all memory cells.

The further advantages of this invention may be readily noted with reference to the drawings.

Figure 1:
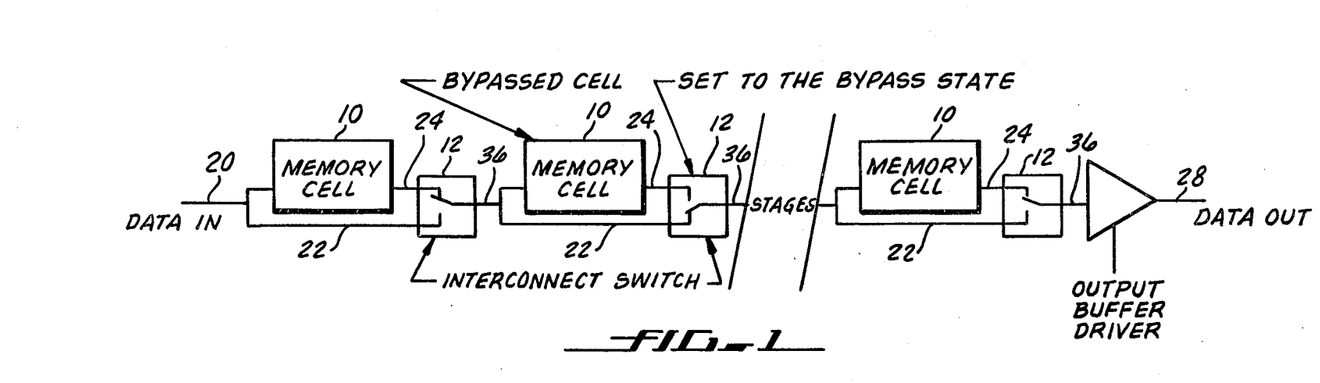
FIG. 1 is a schematic block diagram of a plurality of interconnected memory cells.
Figure 2:
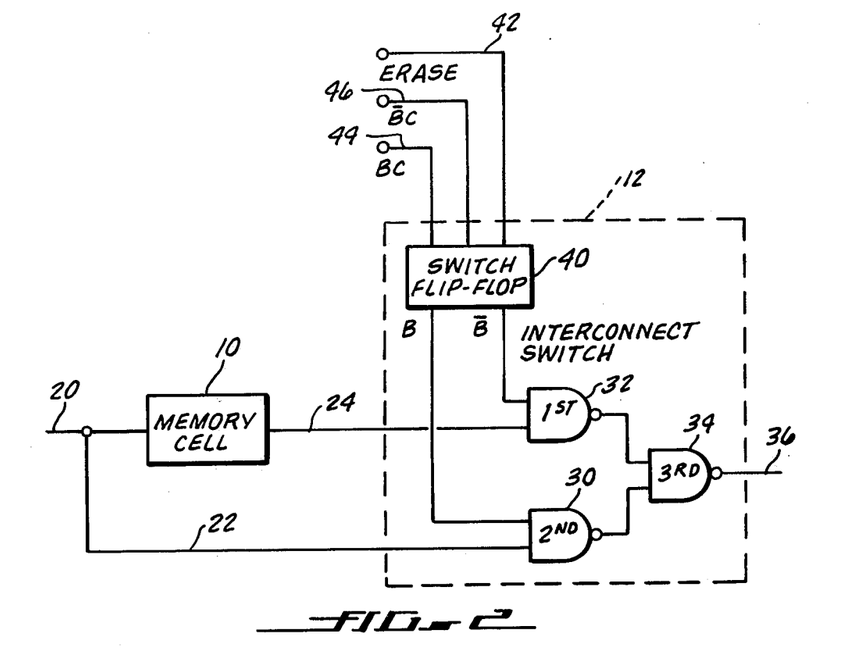
FIG. 2 is a logic diagram of the interconnect switch associated with each memory cell.

With reference to the drawings FIG. 1 illustrates a plurality of memory cells 10, although the particular cells could be a series of any particular pipe-lined serial circuitry, connected in series through an interconnect switch 12. Only three such configurations are shown although it is understood that any number of such connections may be made on a wafer limited only by the size of the particular substrate. In this particular configuration the center illustrated interconnect switch is set to the bypass state, that is, data in on line 20 will bypass the associated memory cell 10 on line 22 by virtue of the fact that the interconnect switch senses data only on the bypass line 22 and ignores data output from the memory cell on output line 24. An examination of FIG. 2 shows a detailed logic diagram of the memory cell 10 and the interconnect switch 12 configuration. Interconnect switch 12, defined by the dotted line, contains a switch flip-flop with a nonvolatile MNOS memory cell. The nonvolatile MNOS memory cell insures the configuration stability of the interconnect switch. Therefore, with the MNOS memory cell being independent of power transients and power failures, once the interconnect switch is set, it remains in that pass, high ($\bar{B}$), or bypass, high (B), state. The pass or bypass output states are complementary, that is, when one is in an electrically low state the other is in an electrically high state. Each of these outputs is input to an individual "NAND" gate. B going to "NAND" gate 30 and $\bar{B}$ going to "NAND" gate 32. Output from the memory cell on line 24 is connected to "NAND" gate 32. The bypass line 22 is connected to "NAND" gate 30 the output of "NAND" gate 30 and 32 is then connected to "NAND" gate 34 which outputs on output line 36. As may be noted, when B is equal to 0, $\bar{B}$ will be equal to 1, this forces the output of gate 32 to correspond to the inverse of the output of the memory cell on line 24. Gate 30, with B input at 0, on the other hand, will not pass whatever information appears on the bypass line 22 to the "NAND" gate 34. "NAND" gate 34 will again invert that input from line 24 and output data on line 36 which is representative of the data passing through the memory cell. A reverse of the state of the switch flip-flop causing B to be equal to 1 and $\bar{B}$ equal to 0 will ignore the input on line 24 and pass data on line 22. Switch flip-flop 50 has three control lines, a B input line (BC) a $\bar{B}$ input line ($\overline{BC}$) and an erase input line. Switch flip-flop 40 contains MNOS type memory cells and before a given state can be set into the switch flip-flop, an ERASE pulse (Vesw) must appear on erase line 42 to clear the MNOS memory, thereafter either the B or the $\bar{B}$ input lines may be momentarily grounded to set the flip-flop into the particular state desired. That is, if output B is to be high thereby bypassing the memory cell a ground should be placed on the B input line BC. This will set the output of B equal to 1 and the output of $\bar{B}$ equal to 0 effecting the bypass of the memory cell as described before. If the reverse is desired then the $\bar{B}$ input line $\overline{BC}$ must be grounded thereby setting $\bar{B}$ output to a 1 and B output to a 0 thereby accepting information from the memory cell.

Figure 3:
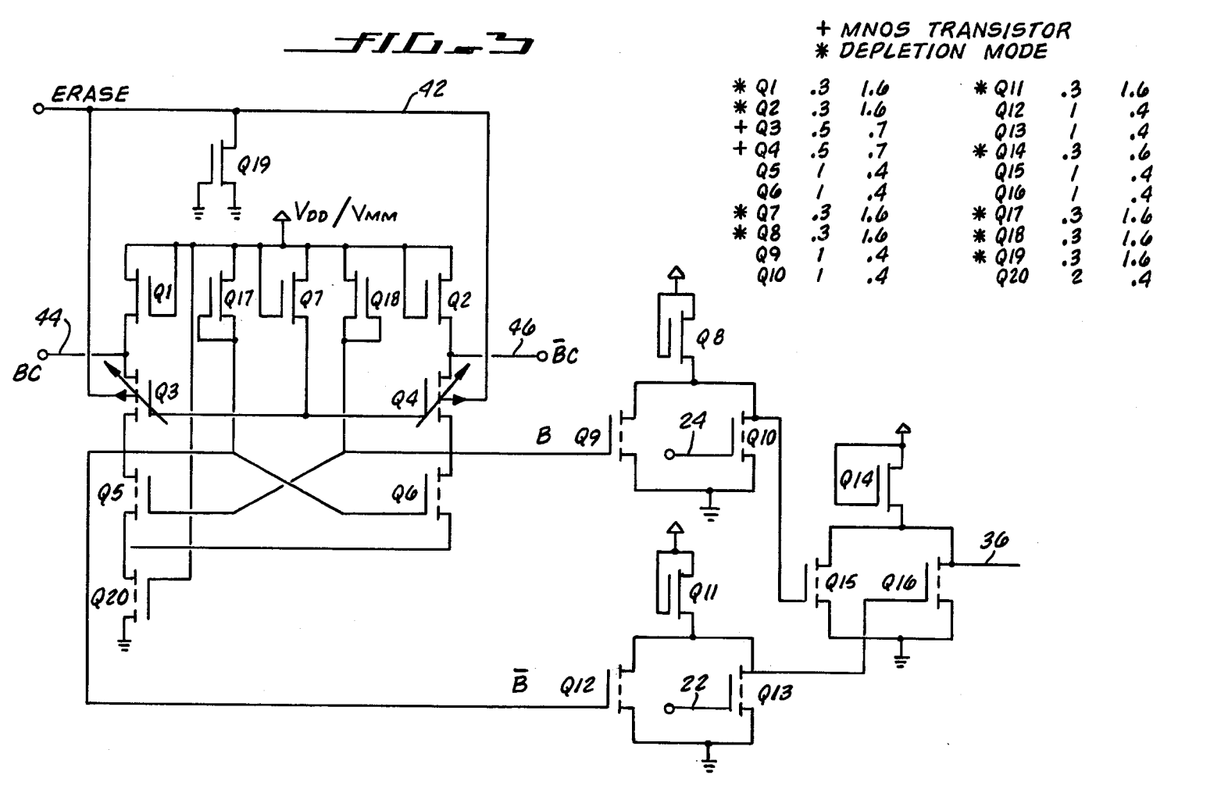
FIG. 3 is a circuit diagram of the interconnect switch and associated logic.

More specifically as shown in FIG. 3, the MNOS transistors Q3 and Q4 must be erased, that is, placed in their low conductivity state prior to writing the desired information into the MNOS transistor. Accordingly, the $V_{DD}/V_{MM}$ interconnect switch power bus is grounded while an ERASE pulse is applied to the erase line 42 which is connected to the substrate. After the prescribed erase pulse (Vesw) is applied to the ERASE line Q3 or Q4 may be written by grounding a selected Bypass BC or Pass $\overline{BC}$ line while leaving the unselected line at open circuit, and re-establishing the voltage at line $V_{DD}/V_{MM}$ to $V_{DD}$. The normal condition for the Bypass BC and Pass $\overline{BC}$ lines is open circuit. The Bypass Control (BC) is line selected (grounded) to bypass the associated memory cell or the Pass Control ($\overline{BC}$) is selected (grounded) to include the associated memory cell on the data path. After selecting the appropriate Bypass or Pass line, a minus 30 volts ($V_{MM}$) SWITCH WRITE pulse is applied to the $V_{DD}/V_{MM}$ power bus which places the selected MNOS transistor in a low conductance state. This completes the ERASE/WRITE cycle for the interconnect switch cells. All grounded Bypass and Pass inputs are then returned to their normal open circuit condition. Minus 15 volts ($V_{DD}$) is applied to the $V_{DD}/V_{MM}$ bus and normal chip operation is resumed.

FIG. 3 shows the circuit configuration for the interconnect switch and the associated logic. Q3 and Q4 are MNOS transistors which provide the nonvolatile memory for the interconnect switch. Q5 and Q6 are enhancement mode transistors which latch the state of the switch flip-flop and output the bypass BC and Pass $\overline{BC}$ states on the B output line and $\bar{B}$ output line, respectively connected to enhancement mode transistors Q9 and Q12. Transistors Q1, Q2, Q17 and Q18 are bias load devices and Q7 provides current limiting functions for the MNOS transistor gates. Q19 acts as voltage protect device.

Q1, Q2, Q7, Q8, Q11, Q14, Q17, Q18 and Q19 are all depletion mode transistors used primarily to control current in the particular circuit configuration. Q8, Q9, Q10 and Q11, Q12, Q13 and Q14, Q15, Q16 form the three "NAND" gates 30, 32 and 34 required for the interconnect previously described.

Figure 4:
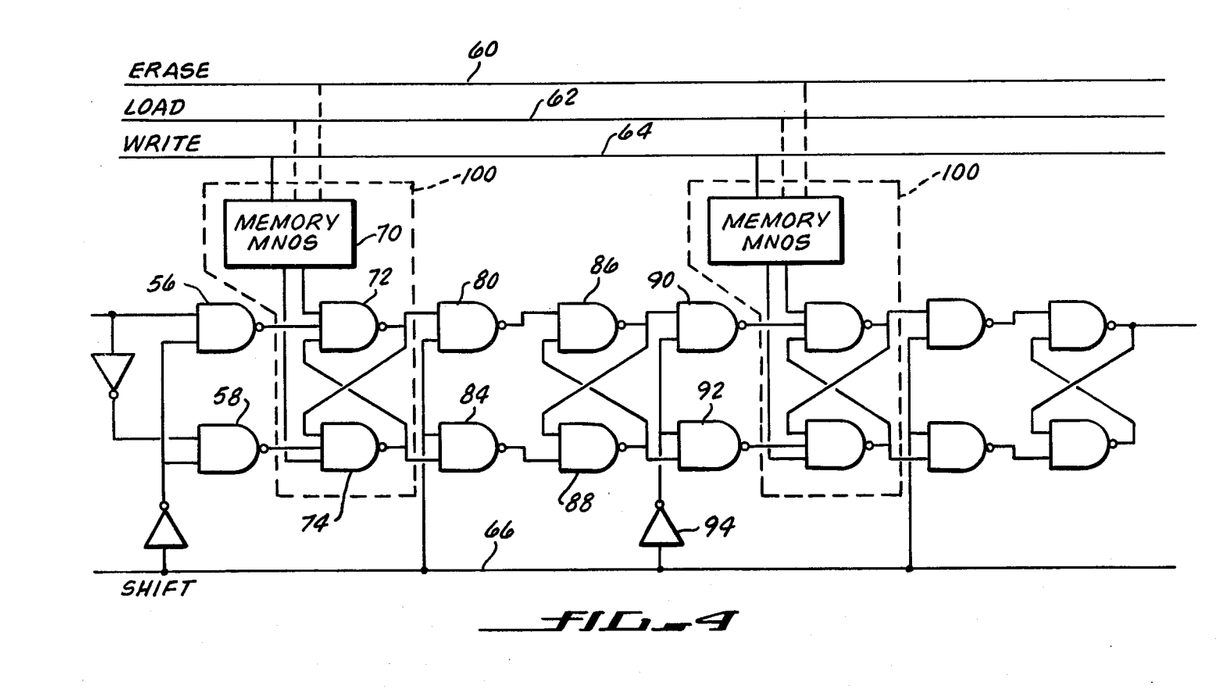
FIG. 4 is a logic diagram of a memory cell having a plurality of submemory cells in parallel with a shift register.

FIG. 4 is a logic diagram of a particular memory cell. Only two MNOS nonvolatile memory subcircuits 100 defined by a dotted line are shown along with the two bit parallel shift register for clarity, although numerous such subcells could be interconnected. An erase line 60 load line 62 and a write line 66 are shown interconnected with the subcircuit 100. The data latch of the memory subcircuit, logically represented by the interconnected NAND gates 72 and 74, are also functionally shared as the shift register latch. Proper timing signals are illustrated in FIG. 7.

Figure 5:
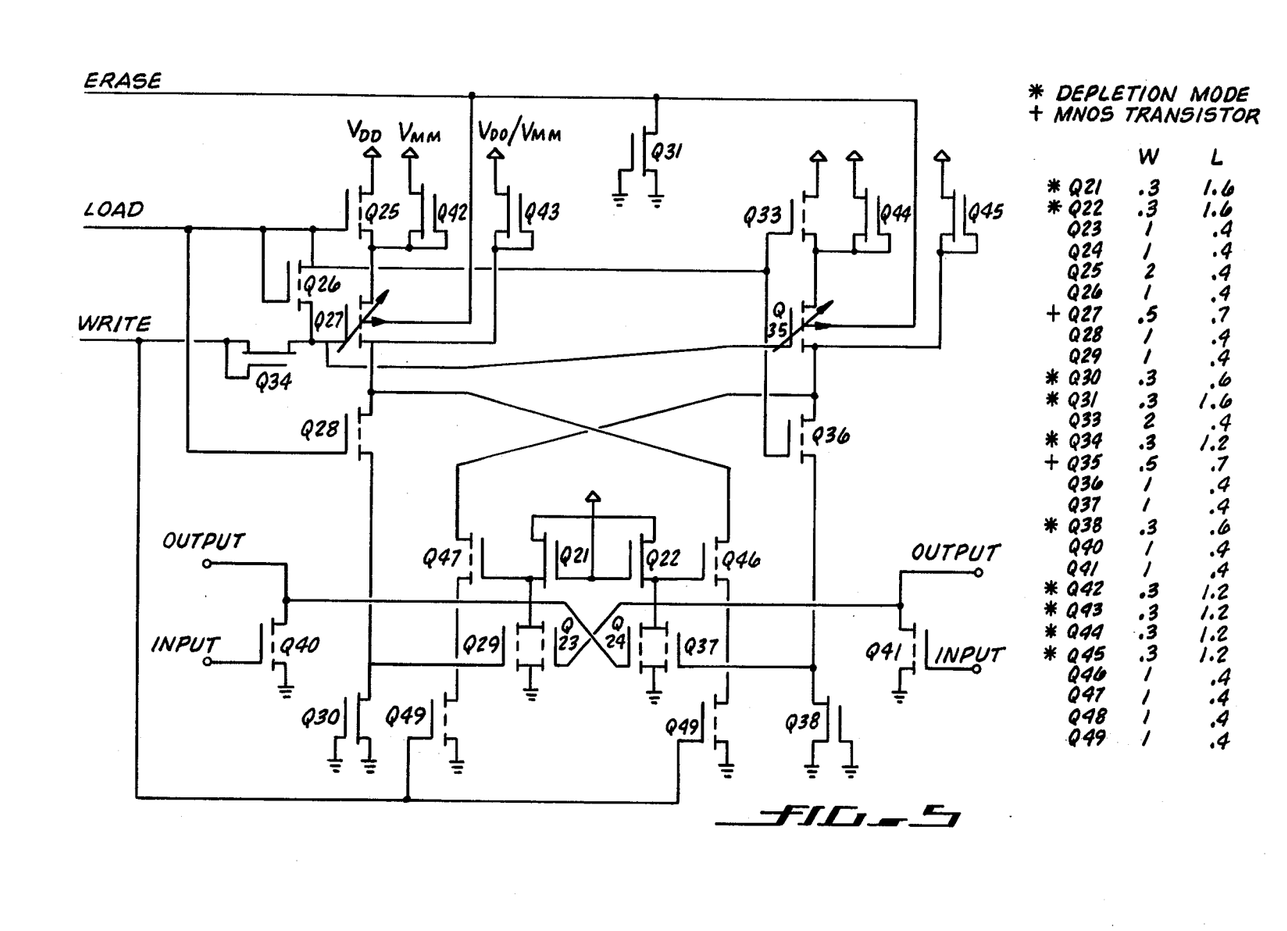
FIG. 5 is a circuit diagram of the submemory cell, shift register and associated logic.

FIG. 5 is a detailed circuit diagram of the MNOS memory subcircuit. Transistors Q27 and Q35 are the MNOS load transistors which, in connection with the transistors Q23 and Q24 constitute the nonvolatile memory cell. Q29 and Q37 couple input from the MNOS transistors to the latch on receipt of the LOAD ($V_L$) pulse through enhancement mode transistors Q28 and Q26. Enhancement mode transistors Q46 and Q47 couple the output of Q23 and Q24 to the inputs of Q23 and Q24 thus forming the latch portion of the circuit. Enhancement mode transistors Q40 and Q41 couple the input from the prior stage into the latch circuit when it is functionally part of the shift register circuit. Depletion mode transistors Q41, Q42, Q30, Q34, Q38, Q42, Q43, Q44 and Q45 provide current limiting functions within the circuit. Q26, Q28 and Q36 couple the LOAD pulse ($V_L$) with the latch circuit. Q26 also turns on Q25 and Q33 which are enhancement mode transistors thereby driving current through the MNOS transistors Q27 and Q35 respectively. Depletion mode transistor Q31 is voltage protect device. Enhancement mode transistors Q48 and Q49 provide coupling of the information in the latch Q3 and Q4 through Q27 and Q26 into the MNOS transistors on receipt of a WRITE pulse ($V_W$). ERASE ($V_E$) operates as in the interconnect switch.

Figure 6:
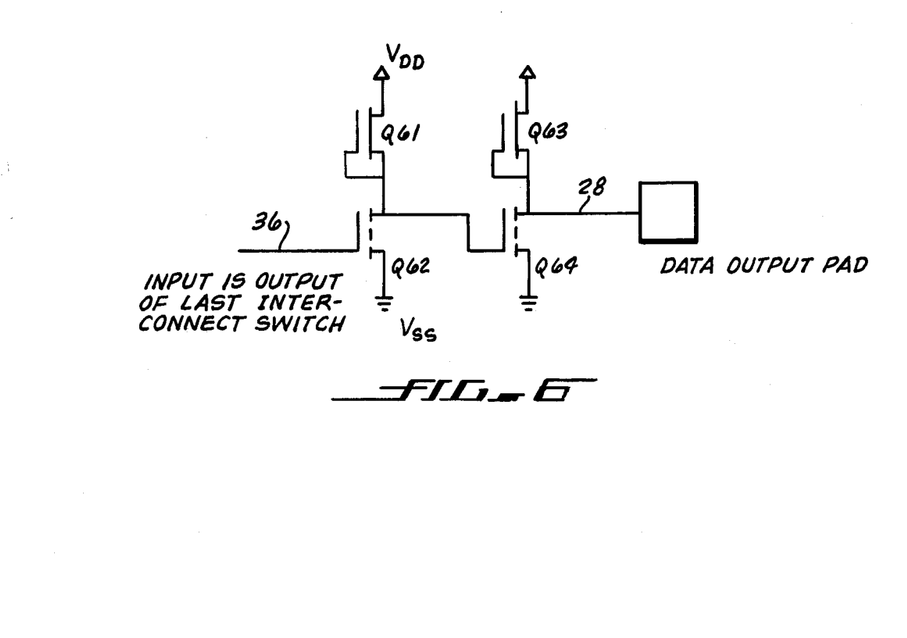
FIG. 6 is a circuit diagram of the output buffer of the memory cell.

FIG. 6 is a circuit diagram of output buffer driver 26 and is simply a two-stage enhancement mode transistor amplifier where in Q62 and Q64 form the two-stage amp. Q61 and Q63 provide current limiting functions in the circuit. Input line 36 and output line 28 are shown on the diagram for clarity.

Figure 7:
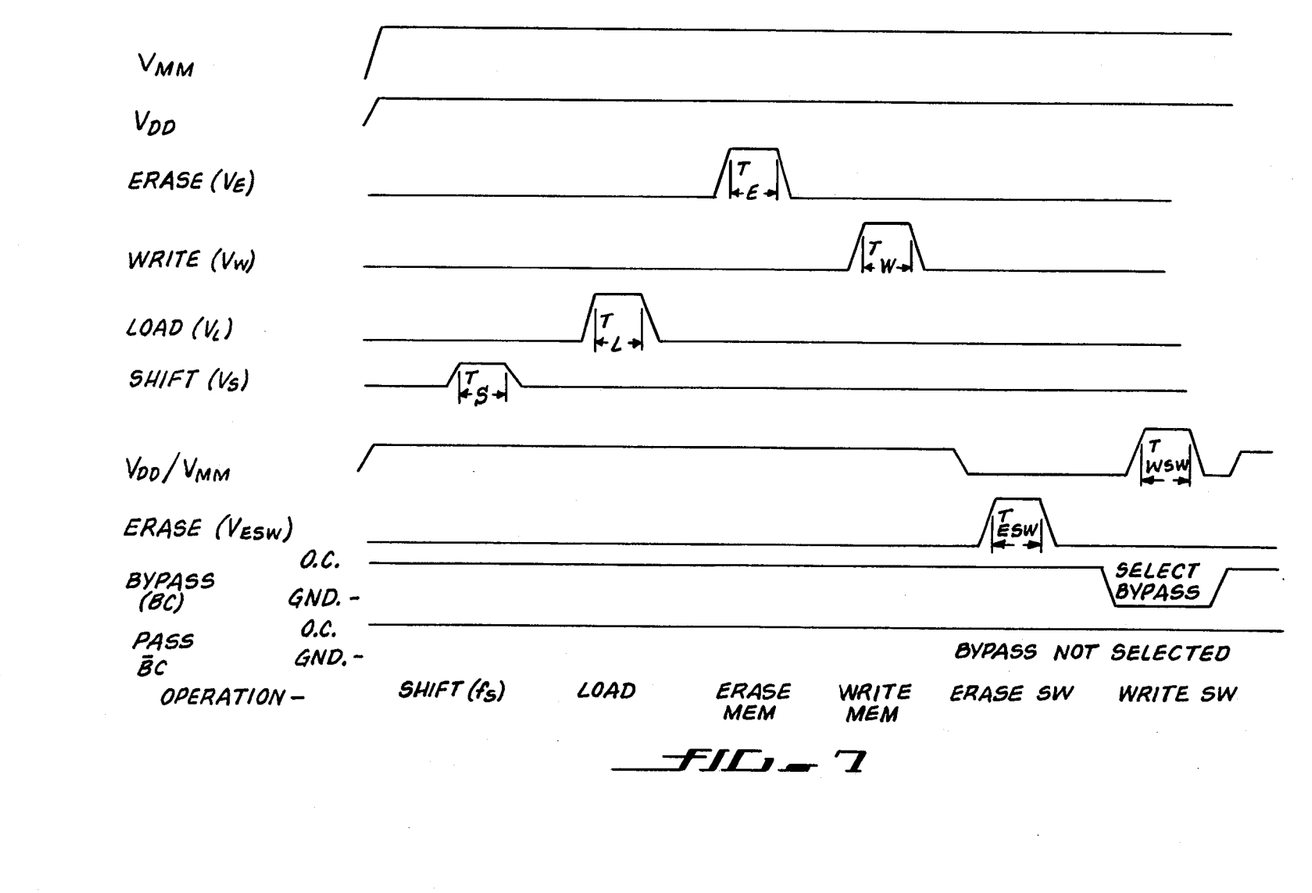
FIG. 7 is a graphical representation of the timing required for cell operation.

FIG. 7 illustrates the timing signals to be applied to the disclosed apparatus for all modes of operation herein described.

What is claimed is:

1. An adaptive integration apparatus for interconnection of integrated circuit cells on a substrate comprising:
    a. at least one integrated circuit cell having an input and an output,
    b. a bus, and
    c. means for selectively coupling said cell to said bus including, means for bypassing said cell,
       an interconnect means capable of assuming at least one of two states coupled to said cell, said bus and said bypass means, and
       means for changing the state of said interconnect means so as to selectively bypass said cell by interconnecting said bypass means and alternatively interconnecting said cell.

2. An apparatus as described in claim 1, wherein said interconnect means comprises:
    a. a means for storing at least one bit of information capable of assuming either of two states,
    b. means for comparing the state of said bit with said cell output, and
    c. said apparatus further comprising means for outputting information based on the result of said comparison.

3. An adaptive integration apparatus for selective electrical interconnection of a plurality of cells comprising:
    a. a plurality of cells each having at least one input line and one output line,
    b. a bypass bus connected to each input line, and
    c. means for selectively coupling electrical signals on said bus and said output line of at least one cell to at least one input line of another cell including,
       means for storing at least one bit of information as either a high or low state,
       means for comparing the signal on said bus and the signal on the output of said cell with said stored information, and
       means responsive to the result of said comparison for selectively outputting a signal indicative, of said bus signal and alternatively indicative of said cell signal dependent on the state of said stored information.

4. An apparatus as described in claim 3, wherein said comparing means comprises:
    a. a first logic gate for comparing the stored information with the output signal of said cell and generating a first output signal in response thereto;
    b. a second logic gate for comparing the bus signal with the stored information and generating a second output signal in response thereto, and
    c. wherein said responsive means is a third logic gate for comparing the first and second output signals and generating a third signal signal in response thereto.

5. An apparatus as described in claim 4, wherein said logic gates are "NAND" gates connected as follows:
    a. a first "NAND" gate having two input lines and an output line connected such that a first output signal from said storing means is input to said gate on one input line concurrent with the output signal of said cell input to said gate on the other input line,
    b. a second "NAND" gate having two input lines and an output line connected such that a second output signal from said storing means being the opposite of said first output is input to said gate on one input line concurrent with the input of said bus signal input to said gate on the other input line, and
    c. a third "NAND" gate having two input lines and an output line connected such that the output line of said first gate is connected to one input line and the output line of said second gate is connected to the other input line,
       whereby, a signal on the cell input causes an equivalent signal to appear on said output line of said third gate when said first output is high and whereby a signal on the cell output causes an equivalent signal to appear on said output line of said third gate when said second output is high.

6. An apparatus as described in claim 3, wherein said storing means is an electronic circuit comprising:
    a. a nonvolatile section, and
    b. a latch section for sensing the condition of said nonvolatile section.

7. An apparatus as described in claim 6, wherein said nonvolatile section comprises:
    a. a pair of MNOS transistors connected in parallel each coupled to a separate input line at their drains,
    b. a current source connected to the gate of each MNOS transistor, and
    c. an erase line connected to the substrate of said MNOS transistors, and wherein each latch comprises:
       a pair of enhancement mode transistors each having their respective drains connected to the source of one of the MNOS transistors connected in parallel cross coupled to their drain and gate respectively thereby forming a latch, a current source connected to the gate of each enhancement mode transistors, and an output line from the drain of each enhancement mode transistor for outputting a signal representative of the conductive state of the MNOS transistors.

8. A memory apparatus comprising:
a. a nonvolitale memory portion,
b. a shift register including,
  a plurality of logic gates connected in parallel,
  a plurality of such paralled logic gate combinations connected in series wherein each group of alternate parallel logic gates connected in series are interconnected to form a latch, and
  means for clocking said register,
c. means for transferring information between said memory portion and said shift register.

9. A memory apparatus as described in claim 8 wherein said nonvolatile memory portion comprises:
a. a pair of MNOS transistors connected in parallel each coupled to a separate input line at their drains,
b. a current source connected to the gate of each MNOS transistor,
c. a pair of enhancement mode transistors each having their respective drains coupled to the source of one of the MNOS transistors connected in parallel and cross coupled at their drain and gate respectively thereby forming at least one of said logic gate latches,
d. an erase line connected to the substrate of said MNOS transistors, and
e. a plurality of control connections coupled to said MNOS transistors.

10. A memory apparatus as described in claim 9 wherein said control connections further comprise:
a. a load line, and
b. a write line.

11. A memory apparatus as described in claim 10 wherein said erase line is connected to the substrate of each MNOS transistor, said load line is coupled to each MNOS transistor through a plurality of transistors and said write line is coupled to the gate of each MNOS transistor.

12. A memory apparatus as described in claim 11 wherein said plurality of transistors further comprises:
a. at least one first transistor coupling said load line to the drains of each MNOS transistor,
b. at least one second transistor coupling said load line to the gates of each MNOS transistors, and
c. at least one third transistor coupling said load line to the source of each MNOS transistor.

13. An adaptive integration apparatus for interconnection of integrated circuit cells on a substrate comprising:
a. a plurality of integrated circuit cells each having control, input and output lines, said control line for receiving coupling instructions,
b. a bus, and
c. means for selectively coupling said cell to said bus in accordance with said coupling instruction, said selective coupling means electrically alterable for nonvolatile storage of said coupling instruction.

14. Apparatus as described in claim 13 wherein said selective coupling means comprises:
a. means for bypassing said cell,
b. interconnect means capable of assuming at least one of two states coupled to said cell, said bus and said bypass means, one state enabling said bypass means and the opposite state disenabling said bypass means and interconnecting said cell to said bus,
c. means for changing the state of said interconnect means whereby said cell is selectively bypassed by enabling said bypass means and alternatively interconnecting said cell.

15. An apparatus as described in claim 14, wherein said interconnect means comprises:
a. means for volatile storage of at least one first bit of information capable of assuming either of two states,
b. means for nonvolatile storage of at least one second bit of information, and
c. means for utilizing said first bit of information to couple and alternatively uncouple at least one of said cells to said bus to permit selective intercell communication of said second bit through said bus.

16. An adaptive integration apparatus responsive to system signals for selective electric interconnection of a plurality of cells comprising:
a. a plurality of cells, each having at least one input line and one output line,
b. a plurality of busses, at least one bus connected to each input line for carrying system signals, and
c. means for alternatively coupling at least one of said busses and said output line of at least one cell to at least one input line for another cell.

17. An apparatus as described in claim 16, wherein said alternatively coupling means comprises:
a. means for storing at least one bit of information as either a high or low state responsive to a control signal,
b. means for comparing the input and output of said cell with said stored information,
c. means responsive to the result of said comparison for outputting a signal, and
d. means to amplify such signal in connection with system signals from the bus such that said signal is routed to said input line of said other cell.

18. An apparatus as described in claim 17, wherein said means for storing said information comprises: a pair of nonvolatile memory transistors interconnected such that when one transistor is in a high conductivity state the other transistor is in a low conductivity state, each transistor having its own output line.

19. An apparatus as described in claim 18, wherein said cells are responsive to a plurality of control signals and each cell comprises:
a. means for nonvolatile storage of at least one bit of information as either a high or a low state responsive to at least one of said control signals, and
b. means for volatile storage of at least one bit of information as either a high or a low state responsive to at least one of said control signals,
  whereby said cells may store separate bits of information in said nonvolatile and volatile means concurrently.

20. An apparatus as described in claim 19, wherein said apparatus further comprises: means for transferring said bit of information between said nonvolatile and volatile storage means.

21. An apparatus as described in claim 20, wherein said apparatus further comprises: means for selectively outputting said volatile and alternatively said nonvolatile information bits in response to different control signals.

22. An adaptive integration apparatus for selective electrical interconnection of a plurality of cells comprising:
   a. a plurality of cells each having at least one input line and one output line,
   b. a bus connected to each input line, and
   c. means for selectively coupling said bus and said output line of at least one cell to at least one input line of another cell, said selectively coupling means comprising:
      1. means for storing at least one bit of information as either a high or low state,
      2. means for comparing the input and output of said cell with said stored information, said comparing means comprising: a first logic gate for comparing the stored information with the output of said cell and generating a first output in response thereto, a second logic gate for comparing the input to said cell with the stored information and generating a second output in response thereto, and wherein said responsive means is a third logic gate for comparing the first and second outputs and generating a signal in response thereto, wherein said logic gates are "NAND" gates connected as follows:
         (a) a first "NAND" gate having two input lines and an output line connected such that a first output from said storing means is input to said gate on one input line concurrent with the output of said cell input to said gate on the other input line,
         (b) a second "NAND" gate having two input lines and an output line connected such that a second output from said storing means being the opposite of said first output is input to said gate on one input line concurrent with the input of said cell input to said gate on the other input line, and
         (c) a third "NAND" gate having two input lines and an output line connected such that the output line of said first gate is connected to one input line and the output line of said second gate is connected to the other input lines, and
      3. means responsive to the result of said comparison for outputting a signal indicative of said result, whereby, a signal on the cell input causes an equivalent signal to appear on said output line of said third gate when said first output is high and whereby a signal on the cell output causes an equivalent signal to appear on said output line of said third gate when said second output is high.

23. An adaptive integration apparatus for selective electrical interconnection of a plurality of cells comprising:
   a. a plurality of cells each having at least one input line and one output line,
   b. a bus connected to each input line, and
   c. means for selectively coupling said bus and said output line of at least one cell to at least one input line of another cell, said selectively coupling means comprising:
      1. means for storing at least one bit of information as either a high or low state, said storing means comprising an electronic circuit including a nonvolatile section, and a latch section for sensing the condition of said nonvolatile section,
      2. means for comparing the input and output of said cell with said stored information, and
      3. means responsive to the result of said comparison for outputting a signal indicative of said result.

24. An apparatus as described in claim 23, wherein said nonvolatile section comprises:
   a. a pair of MNOS transistors connected in parallel each coupled to a separate input line at their drains,
   b. a current source connected to the gate of each MNOS transistor, and
   c. an erase line connected to the substrate of said MNOS transistors, and wherein said latch comprises:
   d. a pair of enhancement mode transistors each having their respective drains connected to the source of one of the MNOS transistors connected in parallel cross coupled at their drain and gate respectively thereby forming a latch,
   e. a current source connected to the gate of each enhancement mode transistors, and
   f. an output line from the drain of each enhancement mode transistor for outputting a signal representative of the conductive state of the MNOS transistors.

25. A memory apparatus comprising:
   a. a nonvolitale memory portion, said nonvolatile memory portion comprising:
      1. a pair of MNOS transistors connected in parallel each coupled to a separate input line at their drains,
      2. a current source connected to the gate of each MNOS transistor,
      3. a pair of enhancement mode transistors each having their respective drains coupled to the source of one of the MNOS transistors connected in parallel and cross coupled at their drain and gate respectively thereby forming at least one of said logic gate latches,
      4. an erase line connected to the substrate of said MNOS transistors, and
      5. a plurality of control connections coupled to said MNOS transistors,
   b. a shift register, said shift register further comprising:
      1. a plurality of logic gates connected in parallel,
      2. a plurality of said parallel logic gate combinations connected in series, alternate ones of said parallel logic gates combinations connected in series being interconnected to form a latch, and
      3. means for clocking said register, and
   c. means for transferring information between said memory portion and said shift register.

26. A memory apparatus as described in claim 25 wherein said control connections further comprise:
   a. a load line, and
   b. a write line.

27. A memory apparatus as described in claim 26 wherein said erase line is connected to the substrate of each MNOS transistor, said load line is coupled to each MNOS transistor through a plurality of transistors and said write line is coupled to the gate of each MNOS transistor.

28. A memory apparatus as described in claim 27 wherein said plurality of transistors further comprises:
   a. at least one first transistor coupling said load line to the drains of each MNOS transistor, b. at least one second transistor coupling said load line to the gates of each MNOS transistors, and c. at least one third transistor coupling said load line to the source of each MNOS transistor.

29. The interconnect apparatus described in claims 8, 9, 10, 11 or 12 further comprising:

a. a memory cell, for storing a control word coupled to said shift register, b. a sensing means for sensing said control word, and outputting a control signal, and c. means for inhibiting said transferring means in response to said control means.

* * * * *